United States Patent
Rosenquist et al.

(10) Patent No.: US 6,768,288 B2
(45) Date of Patent: Jul. 27, 2004

(54) CIRCUIT FOR DETECTING LOW BATTERY CONDITION ON AN ELECTRONIC DEVICE WITH A CHANGING LOAD

(75) Inventors: Russell M. Rosenquist, Plano, TX (US); David D. Baker, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/321,219
(22) Filed: Dec. 17, 2002

(65) Prior Publication Data
US 2004/0113590 A1 Jun. 17, 2004

(51) Int. Cl.$^7$ .................. H01M 10/44; H01M 10/46
(52) U.S. Cl. ............................................. 320/132
(58) Field of Search .................... 320/132, 134, 320/135, 136, 149; 702/63; 324/426, 430, 433

(56) References Cited

U.S. PATENT DOCUMENTS

| 4,678,998 A | | 7/1987 | Muramatsu |
| 4,888,716 A | * | 12/1989 | Ueno .......................... 702/63 |
| 5,193,067 A | * | 3/1993 | Sato et al. ..................... 702/63 |
| 5,341,503 A | * | 8/1994 | Gladstein et al. ........... 713/340 |
| 6,313,609 B1 | | 11/2001 | Brink |

* cited by examiner

Primary Examiner—Edward H. Tso
(74) Attorney, Agent, or Firm—Bret J. Petersen; W. James Brady, III; Frederick J. Telecky, Jr.

(57) ABSTRACT

A method to more accurately monitor remaining battery life under varying load conditions. The measured battery voltage is adjusted for the current load and then used to determine the remaining battery life according to the battery voltage discharge curve for the battery type and chemistry. Advantageously, in an embodiment the present invention the remaining battery life can be determined despite fluctuations in the current due to a changing load and without monitoring current flow so that the determination of battery life is independent of the battery charging process.

13 Claims, 2 Drawing Sheets

CIRCUIT FOR DETECTING LOW BATTERY CONDITION ON AN ELECTRONIC DEVICE WITH A CHANGING LOAD

TECHNICAL FIELD OF THE INVENTION

This invention relates to detecting battery life on portable electronic devices, and more particularly to a system and method for detecting a low battery condition on a hand-held computer device such as hand-held calculators, personal digital assistant (PDA) or personal learning tool (PLT).

BACKGROUND OF THE INVENTION

Determining the amount of remaining battery life is an important aspect of many portable electronic devices. In some prior art devices, it was common to simply measure the voltage of the battery under load to estimate the remaining battery life. In other prior art devices, "gas gauges" are used to monitor the charge entering and leaving the battery in order to provide an accurate indication of remaining battery life.

Other prior art systems measures battery terminal voltage during each application of one or more constant power loads to the battery, and compares either the measured voltage, or an internal impedance calculated from the measured voltage, with a pre-characterization of the relationship between battery capacity and battery voltage or impedance for the given battery type and operating conditions. See U.S. Pat. No. 6,313,609.

In the prior art methods, the battery life determined by the voltage alone may be inaccurate for systems with a varying load. Further, in prior art methods that monitor battery charge, the battery life indication is not accurate if the battery is changed in the system. In other prior art methods it was necessary to compare measured voltages with known power loads, which may not be available or possible in some electronic devices.

SUMMARY OF THE INVENTION

The present invention provides a method to more accurately monitor remaining battery life under varying conditions. The problem in some prior art circuits was the changing and unknown current would not allow reference to a battery discharge curve to accurately estimate the remaining battery life. In embodiment of the present invention, the measured battery voltage is adjusted for the current load and then used to determine the remaining battery life according to the battery voltage discharge curve for the battery type and chemistry. The method is particularly advantageous in a system where the battery may be exchanged and where the load varies dramatically over time.

An advantage of an embodiment the present invention is remaining battery life can be determined despite fluctuations in the current due to a changing load.

Another advantage of an embodiment the present invention is remaining battery life can be determined without monitoring current flow so that the determination of battery life is independent of the battery charging process.

Another advantage of an embodiment the present invention is remaining battery life can be determined with a low cost circuit where much of the required hardware is already available on the electronic device.

BRIEF OF THE DRAWINGS

DETAILED DESCRIPTION OF THE INVENTION

Figure 1:
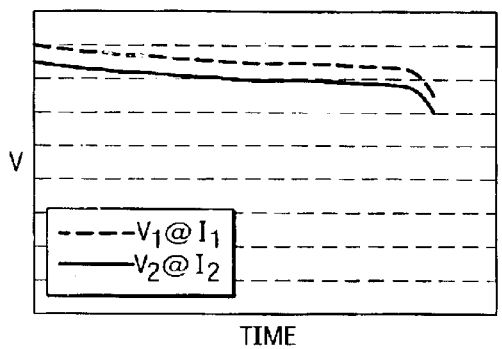
FIG. 1 illustrates a typical battery voltage discharge curve according to the prior art.

FIG. 1 illustrates a typical battery voltage discharge curve. A set of curves is related to a single battery and is usually provided by the battery manufacturer. Each plotted curve on FIG. 1 shows the battery voltage as a function of time for a given fixed load current. The shape of the curves will vary depending on the battery manufacturer and the battery chemistry. The area under the curve reflects the battery capacity is and is fairly constant for a given battery. Therefore, each curve representing different load currents has approximately the same area under the curve. Thus the remaining capacity of a battery can be determined by finding a voltage on the curve and subtracting the used capacity from the initial capacity. Alternatively, a table or graph could be produced that reflects the remaining capacity for a given voltage.

Figure 2:
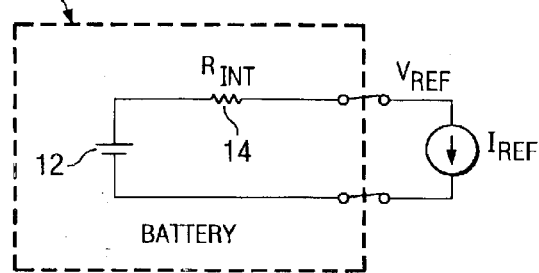
FIG. 2 illustrates a circuit representative of the battery voltage discharge curve shown in FIG. 1 according to the prior art.

FIG. 2 illustrates the circuit for the battery discharge curves shown in FIG. 1. The battery 10 is modeled by a voltage source 12 and an internal resistance $R_{INT}$ 14. The voltage $V_{REF}$ is plotted over time with respect to a fixed current $I_{REF}$. Plotting the voltage for different currents ($I_1$ and $I_2$) gives the curves shown in FIG. 1.

As can be observed from FIG. 1, the remaining battery life (t) changes as a function of the current draw on the battery. In many portable electronic devices, the current draw on the battery may vary quite dramatically. For example, in a PLT, when the wireless interface is active, the current draw increases substantially. The battery life indication circuit must be able to determine the remaining life with the varying current draw. The present invention provides a method to more accurately monitor battery condition under varying conditions, particularly in a system where the battery may be exchanged and where the load varies dramatically over time.

Figure 3:
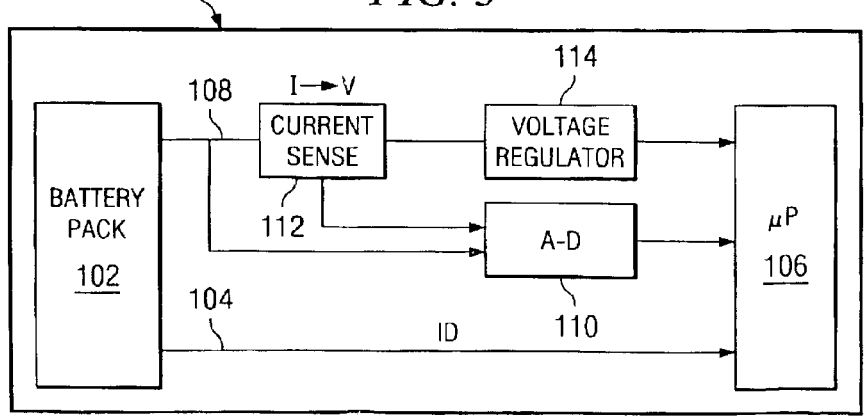
FIG. 3 illustrates a system block diagram according to an embodiment of the present invention.

A system diagram for a portable or hand-held computer device 100 according to an embodiment of the present invention is illustrated by the block diagram shown in FIG. 3. The device 100 includes a battery pack 102 that provides power to the device. The battery pack output has a battery pack identification line 104 to tell the micro-processor 106 the type of battery is installed in the device. This allows the device to use multiple types of batteries with different chemistries.

Again referring to FIG. 3, the battery pack also has a power output 108 that is monitored to determine the remaining life of the battery as described further herein. The voltage of the battery output 108 is applied to an A/D converter 110. The current of the battery output 108 is applied to a current sense circuit 112 that converts the current to a voltage representative of the battery current. The voltage representative of the battery current is also applied to the A/D converter 110. The A/D converter 110 sends to the micro-processor a digital indication of the battery voltage and current. The voltage regulator 114 uses the output of the current sense circuit to maintain the system voltage for the remainder of the device electronics as indicated by the connection to the micro-processor.

Figure 4:
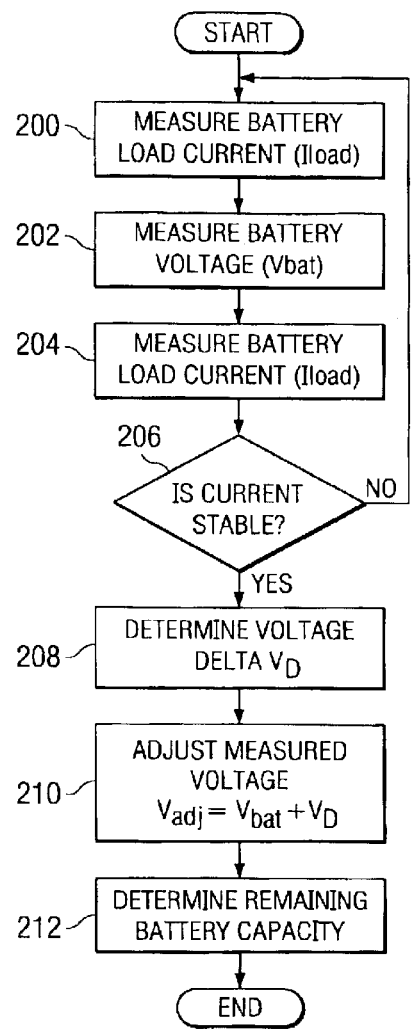
FIG. 4 illustrates a flow chart according to an embodiment of the present invention. invention.

FIG. 4 shows a flow diagram according to an embodiment of the present invention. This method flow uses a circuit such as the circuit diagram shown in FIG. 3. The first step 200 is to measure the battery load current $I_{meas}$. This is accomplished by the micro-processor selecting the input from the current sense circuit to the A/D converter and reading the output of the A/D. The next step 202 is to measure the battery voltage in a similar manner from the A/D converter. The current is then again measured in step 204. The current of the second measurement is compared with the second current measurement to determine if the current has remained fairly constant 206. If the current is constant, then the current $I_{meas}$ measurements can be used and proceed to the next step. If the currents are not constant, then the measurements are repeated by proceeding back to step 200. This process is necessary in the illustrated embodiment to get a current that is representative of the voltage when the load could be changing. In the illustrated embodiment, the A/D does not latch the input current and voltage. Other circuits may not need to repeat the current measurement if the circuit measures or latches the current and voltage contemporaneously.

Step 208 uses the measured current and voltage of the battery to determine a voltage delta. The voltage delta is defined as: $V_D=(I_{meas}-I_{ref})\times R$. The measured current $I_{meas}$ is obtained as described above. The reference current $I_{ref}$ is the reference current for the voltage discharge curve that will be used to compute the battery life. The resistance R is the internal resistance of the current battery pack. This resistance can be stored in memory for each battery pack type and chemistry. In other embodiments, the internal resistance is calculated by comparing different loads or connecting a known load and measuring the current according to the prior art. The calculation of $V_D$ is made with the micro-processor using the values and formula stated above. The voltage delta $V_D$ can then be used to estimate the battery life remaining in the next step.

Step 210 then uses the voltage delta to find the adjusted battery voltage $V_{adj}$. The voltage $V_{adj}$ is found by adding the measured battery voltage $V_{bat}$ with the voltage delta $V_D$. The adjusted voltage represents the voltage of the battery adjusted to the discharge curve for the $I_{ref}$ current. This is the curve that will be used to estimate the remaining battery life.

Step 212 then uses the adjusted voltage $V_{adj}$ to estimate the remaining battery life. The remaining battery life could be communicated to the user as the remaining percentage of the total capacity of the battery. This can be done by finding the corresponding remaining capacity for $V_{adj}$ on the stored discharge curve described above and reporting the capacity to the user as a percentage of total capacity. The discharge curve in a preferred embodiment is a table stored in memory representative of a discharge curve for the battery pack type and chemistry as determined by the battery pack identification line 104. In a preferred embodiment, the voltage discharge curve stored in the table corresponds to the average current draw for the device. If the remaining capacity of the battery is not fairly constant with current draw, multiple discharge curves could be utilized.

The remaining battery life could also be communicated to the user as an estimated time. This could be done by finding the corresponding remaining capacity for $V_{adj}$ on the stored discharge curve as described above, and then dividing by an average current. The average current may be determined by periodically checking the current and taking an average with a sufficient frequency to insure some stability in the reported time to the user.

Figure 5:
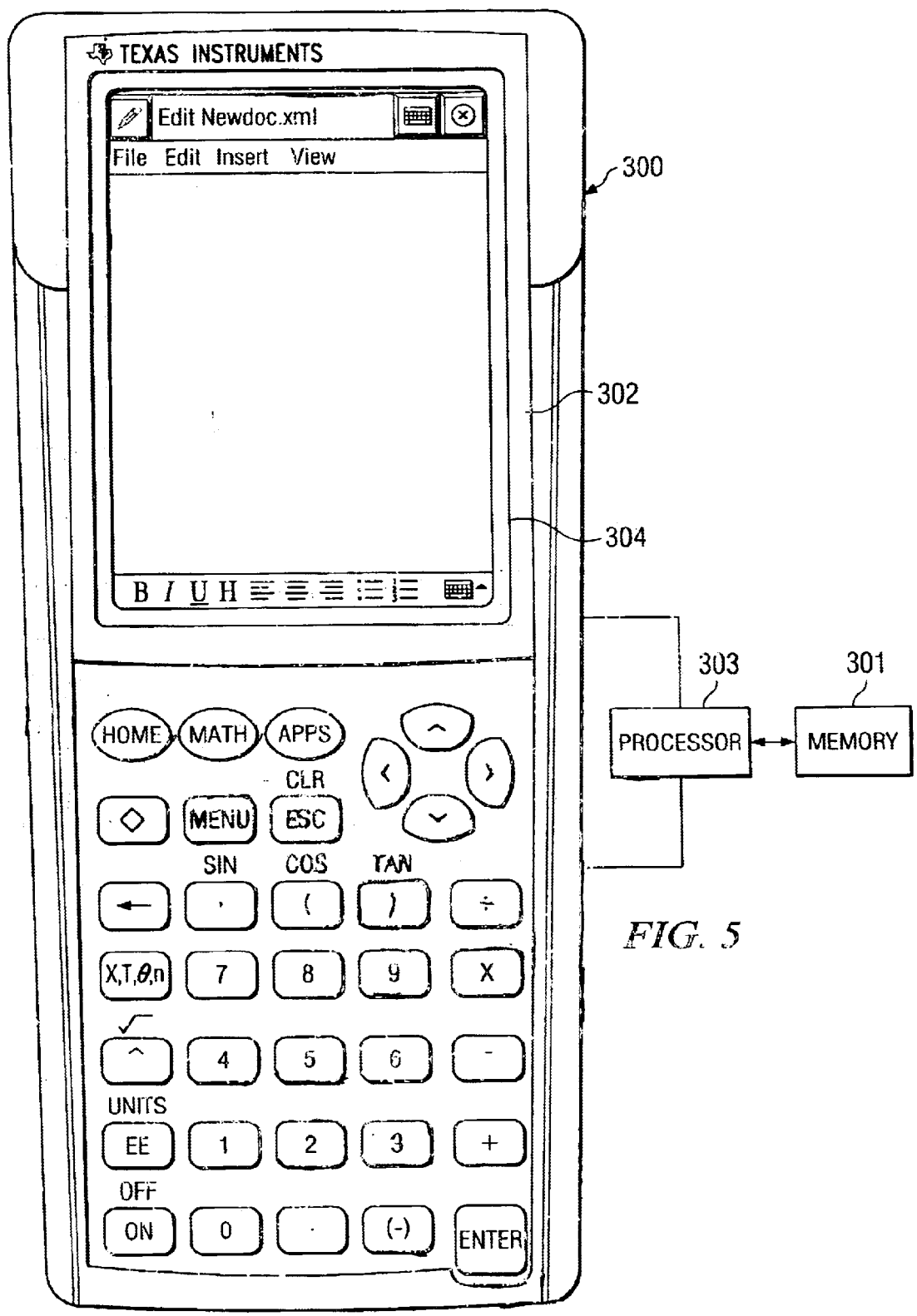
FIG. 5 illustrates a electronic device according to an embodiment of the present invention.

FIG. 5 illustrates a PLT or hand held computing device 300 that is uses the method and circuit of the present invention as described above. The device executes software described herein stored in memory 301 on the micro-processor 303(106 in FIG. 2). The device has a display screen 302 having a display area 304. In this embodiment, the display is a touch sensitive display that uses a stylus for input (not shown). The device has a wireless interface such as wireless PCMCIA card (not shown).

Other Embodiments

Although the present invention has been described in detail, it should be understood that various changes, substitutions, and alterations could be made hereto without departing from the spirit and scope of the invention as defined by the appended claims. The features that are the subject of the present invention could be incorporated into other into other computer based portable electronic tools and computers.

What is claimed is:

1. A circuit for detecting a low battery condition on a portable computer device comprising:
   a. inputs from a battery pack having an internal resistance, where the inputs comprise a battery output voltage and a battery output current;
   b. a current sense circuit to provide a voltage proportional to the battery output current;
   c. an A/D converter which inputs the battery output voltage and the voltage proportional to the battery current and outputs in digital form the measured battery output voltage and measured battery current; and
   d. a micro-processor which inputs the measured battery current and measured battery output voltage;
   e. wherein the micro-processor adjusts the measured battery output voltage based on the measured battery current and the battery internal resistance and then uses the adjusted battery voltage to determine an estimate of remaining battery life according to a battery voltage discharge curve associated with the battery pack.

2. The circuit of claim 1, further comprising a battery ID input to the circuit that indicates to the micro-processor the type and chemistry of the battery in the battery pack to allow the corresponding battery voltage discharge curve to be used to estimate the remaining battery life.

3. The circuit of claim 2, wherein the micro-processor inputs the measured battery current before and after inputting the measured battery output voltage.

4. The circuit of claim 2, wherein the voltage discharge curve represents the battery characteristics for an average current draw on the device.

5. A portable computer device having a circuit for detecting a low battery condition comprising:
   a. inputs from a battery pack having an internal resistance, where the inputs comprise a battery output voltage and a battery output current;
   b. a current sense circuit to provide a voltage proportional to the battery output current;
   c. an A/D converter which inputs the battery output voltage and the voltage proportional to the battery current and outputs in digital form the measured battery output voltage and measured battery current; and
   d. a micro-processor which inputs the measured battery current and measured battery output voltage;
   e. wherein the microprocessor adjusts the measured battery output voltage based on the measured battery current and the battery internal resistance and then uses the adjusted battery voltage to determine an estimate of remaining battery life according to a battery voltage discharge curve associated with the battery pack.

6. The device of claim 5, further comprising a battery ID input to the circuit that indicates to the micro-processor the type and chemistry of the battery in the battery pack to allow the corresponding battery voltage discharge curve to be used to estimate the remaining battery life.

7. The device of claim 6, wherein the micro-processor inputs the measured battery current before and after inputting the measured battery output voltage.

8. The device of claim 5, wherein the portable computer device is a handheld PDA having a wireless interface.

9. The device of claim 5, wherein the portable computer device is a handheld personal learning tool having a wireless interface.

10. The device of claim 5, wherein the voltage discharge curve represents the battery characteristics for an average current draw on the device.

11. A method for detecting a low battery condition on a portable computer device comprising:
   a. inputting from a battery pack having an internal resistance, a battery output voltage and a battery output current;
   b. adjusting the output voltage based on the battery output current and the battery internal resistance;
   c. estimating the remaining battery life according to a battery voltage discharge curve associated with the battery pack using the adjusted battery voltage.

12. The method of claim 11, wherein the micro-processor inputs the battery current before and after inputting the measured battery output voltage.

13. The method of claim 11, wherein the voltage discharge curve represents the battery characteristics for an average current draw on the device.

* * * * *